United States Patent
Kajiyama

(10) Patent No.: US 11,417,721 B2
(45) Date of Patent: Aug. 16, 2022

(54) DISPLAY DEVICE

(71) Applicant: Japan Display Inc., Tokyo (JP)

(72) Inventor: Kenta Kajiyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 198 days.

(21) Appl. No.: 16/984,454

(22) Filed: Aug. 4, 2020

(65) Prior Publication Data

US 2020/0365679 A1    Nov. 19, 2020

Related U.S. Application Data

(63) Continuation of application No. PCT/JP2018/041024, filed on Nov. 5, 2018.

(30) Foreign Application Priority Data

Feb. 7, 2018  (JP) .............................. JP2018-020276

(51) Int. Cl.
*H01L 27/32* (2006.01)
*G02F 1/1362* (2006.01)

(52) U.S. Cl.
CPC .... *H01L 27/3276* (2013.01); *G02F 1/136286* (2013.01)

(58) Field of Classification Search
CPC ... H05K 1/113; G02F 1/13458; G02F 1/1345; G02F 1/13452; H01L 27/3276
See application file for complete search history.

(56) References Cited

U.S. PATENT DOCUMENTS

2012/0154704 A1  6/2012 Nakazawa et al.
2013/0153904 A1  6/2013 Nishimura et al.
2019/0172889 A1* 6/2019 Kajiyama .............. H01L 27/124
2020/0052001 A1* 2/2020 Lee ........................ H01L 27/124

FOREIGN PATENT DOCUMENTS

KR    2017081073 A * 7/2017 ......... H01L 27/3258
WO    2011/024577 A1    3/2011
WO    2012/029644 A1    3/2012

OTHER PUBLICATIONS

Japanese Office Action dated Feb. 1, 2022, for the corresponding Japanese Patent Application No. 2018-020276, with English machine translation.
International Search Report dated Dec. 25, 2018, for the PCT application No. PCT/JP2018/041024, with English translation.

* cited by examiner

*Primary Examiner* — Jose R Diaz
(74) *Attorney, Agent, or Firm* — Michael Best & Friedrich LLP

(57) ABSTRACT

A display device includes: a second wiring layer on the first insulating film, the second wiring layer overlapping with a part of the first pad portion, the second wiring layer including a second pad portion not overlapping with the first line portion; an etching-stop layer overlapping with at least a boundary between the first pad portion and the first line portion; a second insulating film covering the second wiring layer, the second insulating film having a contact hole, the contact hole including a first area where the second insulating film, the first insulating film, and the first pad portion are penetrated, the contact hole including a second area where the second insulating film is penetrated and the second pad portion is a bottom; and a third wiring layer inside the contact hole, the third wiring layer connected to the first pad portion and the second pad portion.

12 Claims, 19 Drawing Sheets

DISPLAY DEVICE

CROSS-REFERENCE TO RELATED APPLICATION

This application is a continuation application of International Application PCT/JP2018/041024 filed on Nov. 5, 2018, which claims priority from Japanese patent application JP2018-020276 filed on Feb. 7, 2018. The contents of these applications are incorporated herein by reference in their entirety.

BACKGROUND

1. Field

This relates to a display device.

2. Description of the Related Art

A display device such as an organic electroluminescence display device has a pixel circuit, for driving a light-emitting element at each pixel, in a laminate including some wiring layers and some insulating films alternately laminated.

FIG. 18A is a plan view of connection structure previously considered by the present inventor(s). FIG. 18B is a cross-sectional view of the connection structure previously considered by the present inventor(s). A signal line layer 3 has a hole filling portion 31 in a contact hole 6a. The hole filling portion 31 covers the whole contact hole 6a in a plan view. The hole filling portion 31 is connected to a pad portion 11 of a semiconductor layer 1 and a pad portion 21 of a gate layer 2, in the contact hole 6a. This establishes electrically connection between the pad portion 11 of the semiconductor layer 1 and the pad portion 21 of the gate layer 2, through the hole filling portion 31. The illustrated hole filling portion 31 fills a through-hole 1a of the pad portion 11 and is connected to the pad portion 11 at an inner edge of the through-hole 1a. In FIG. 18A and FIG. 18B, a typical case is illustrated where the contact hole 6a is formed inside an area of the pad portion 11 or 12 and the hole filling portion 31 is formed entirely inside the contact hole 6a. However, due to manufacturing errors of positions where the contact hole 6a or the hole filling portion 31 should be formed, the semiconductor layer 1 and the gate layer 2 are likely to be poorly connected. For a concrete example, FIG. 19A is a plan view of a referenced connection structure, and FIG. 19B is a cross-sectional view of the referenced connection structure. Assuming that the contact hole 6a has an inner edge displaced toward and beyond a boundary 19 (FIG. 18A) between the pad portion 11 and the line portion 12 and extends to a line portion 12, the pad portion 11 and the line portion 12 are separated, due to the contact hole 6a penetrating the semiconductor layer 1. Additionally, assuming that the hole filling portion 31 has an outer edge displaced inward from an inner edge of the contact hole 6a in front of the line portion 12 and there is a crevice 1c between the hole filling portion 31 and the line portion 12, the line portion 12 is also separated from the hole filling portion 31. This leads to poor electrical connection between the semiconductor layer 1 and the gate layer 2.

Thus, such a referenced display device is designed to have a contact hole for exposing both a first wiring layer and a second wiring layer, with a third wiring layer formed inside them. The first wiring layer and the second wiring layer may be electrically connected through the third wiring layer, but manufacturing errors in position of the contact hole or the third wiring layer may lead to poor connection between the first wiring layer and the second wiring layer.

SUMMARY

This aims at providing a display device capable of suppressing poor connection between wiring layers in a pixel circuit.

A display device includes: a first wiring layer including a first pad portion and a first line portion connected to the first pad portion; a first insulating film covering the first wiring layer; a second wiring layer on the first insulating film, the second wiring layer overlapping with a part of the first pad portion in a plan view, the second wiring layer including a second pad portion not overlapping with the first line portion in the plan view; an etching-stop layer overlapping with at least a boundary between the first pad portion and the first line portion in the plan view; a second insulating film covering the second wiring layer, the second insulating film having a contact hole, the contact hole including a first area where the second insulating film, the first insulating film, and the first pad portion are penetrated, the contact hole including a second area where the second insulating film is penetrated and the second pad portion is a bottom; and a third wiring layer inside the contact hole, the third wiring layer connected to the first pad portion and the second pad portion.

DETAILED DESCRIPTION

Figure 1:
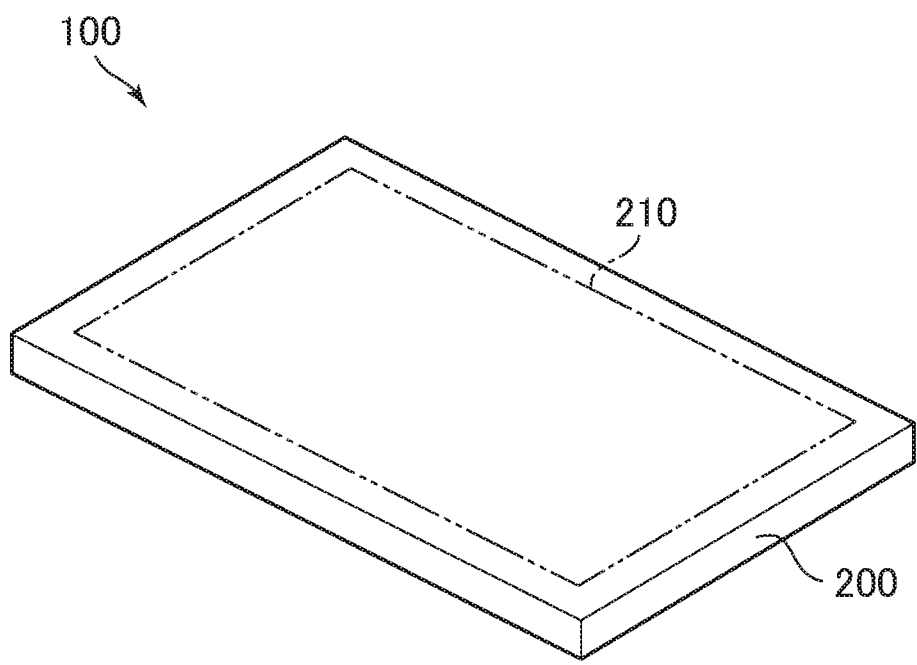
FIG. 1 is an external perspective view of a display device in an embodiment.

Hereinafter, embodiments will be described with reference to the drawings. The disclosed embodiments are merely examples and any various alteration thereof, which can be easily anticipated without departing from the spirit of this invention, intrinsically falls within the scope of the invention. To make description clearer, some figures may schematically illustrate real-life examples, with respect to their dimensions such as width, thickness, and shape thereof, presenting only examples without restrictive interpretation of the invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

FIG. 1 is an external perspective view of a display device in an embodiment. A display device 100 is an organic electroluminescence display device with display elements such as organic light-emitting diodes (OLED). The display device 100 has an array substrate 200. The array substrate 200 has a display area 210 where full-color pixels P, each of which is composed of unit pixels (subpixels) in respective colors such as red, green, and blue, are arranged in a matrix shape.

Figure 2:
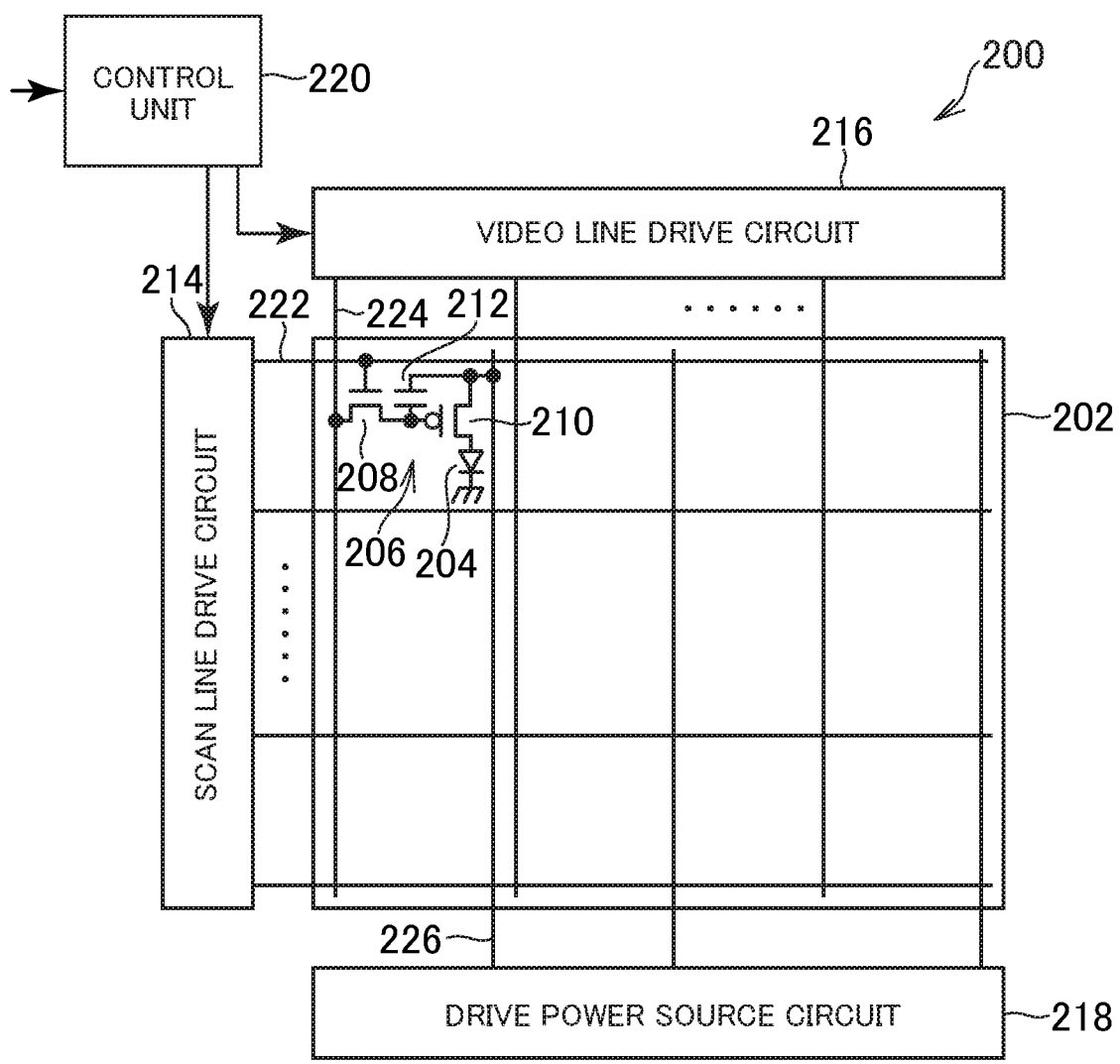
FIG. 2 is a block diagram of an electrical structure of the display device.

FIG. 2 is a block diagram of an electrical structure of the display device. The array substrate 200 has a pixel array portion 202 in the display area 210 (FIG. 1). FIG. 2 shows a circuit structure of one unit pixel in the pixel array portion 202. The unit pixel includes an organic light-emitting diode (OLED) 204 and a pixel circuit 206. The pixel circuit 206 includes a sampling TFT 208, a drive TFT 210, and a capacitor 212. The drive TFT 210 may be a p-type MOSFET.

Additionally, the array substrate 200 has a scan line drive circuit 214 for driving the pixel array portion 202, a video line drive circuit 216, a drive power source circuit 218, and a control unit 220. The scan line drive circuit 214, the video line drive circuit 216, and the drive power source circuit 218 are disposed in a frame area surrounding the display area 210 (FIG. 1).

The scan line drive circuit 214 is connected to a scanning signal line 222 disposed for every unit pixels arranged in a horizontal direction (each pixel row). The scan line drive circuit 214 is configured to sequentially apply voltage to the scanning signal lines 222 to turn on the respective sampling TFTs 208, in response to respective timing signals from the control unit 220 (that is, to sequentially select one of the pixel rows).

The video line drive circuit 216 is connected to a video signal line 224 disposed for every unit pixels arranged in a vertical direction (each pixel column). The video line drive circuit 216 is configured to apply voltage, in response to a video signal from the control unit 220, to each sampling TFT 208 in the pixel column selected by the scan line drive circuit 214. The voltage, in response to the video signal, is written in each capacitor 212 in the selected pixel row, through the sampling TFT 208.

The drive power source circuit 218 is connected to a drive power line 226 disposed for every unit pixels arranged in the vertical direction (each pixel column). The drive power source circuit 218 is configured to apply a current to the OLED 204 through the drive power line 226 and the drive TFT 210. The drive TFT 210 supplies the current, amount of which corresponds to the voltage written in the capacitor 212, to the OLED 204. Thus, the OLED 204 emits light.

Figure 3:
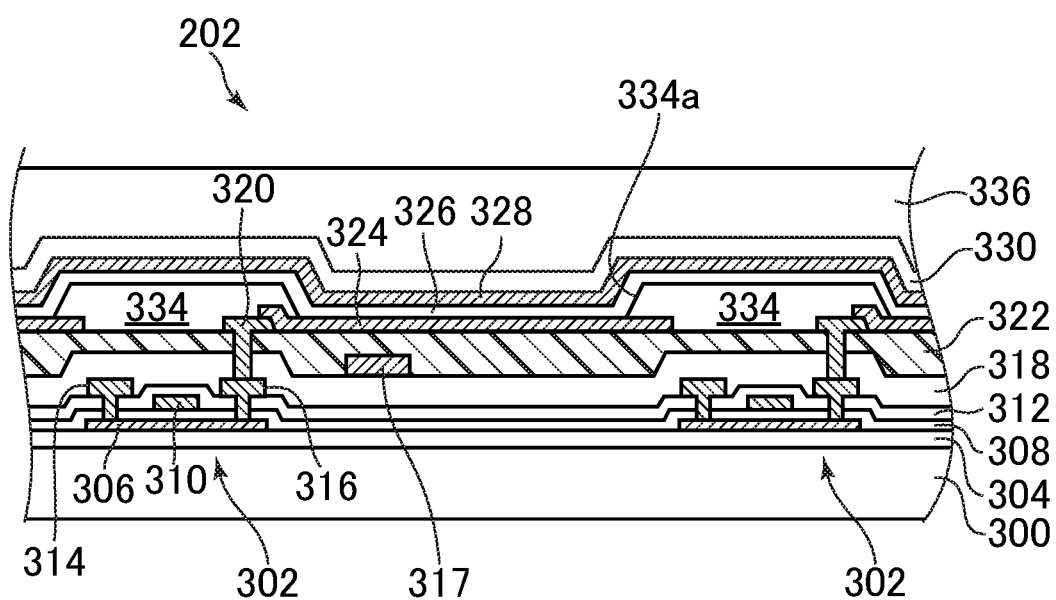
FIG. 3 is a cross-sectional view of a cross sectional structure of the display device.

FIG. 3 is a cross-sectional view of a cross sectional structure of the display device. In FIG. 3, to improve visibility of the cross sectional structure, hatching of some layers is omitted. In the following explanation, a stacking direction is an upward direction.

A substrate 300 is made from glass or flexible resin such as polyimide. The substrate 300 on an upper surface is covered with an undercoat layer 304. A semiconductor layer 306 is on the undercoat layer 304 and is covered with a gate insulating film. A gate electrode 310 is on the gate insulating film 308 and is covered with a passivation film 312. A drain electrode 314 and a source electrode 316 penetrate the gate insulating film 308 and the passivation film 312, and is connected to the semiconductor layer 306. The semiconductor layer 306, the gate electrode 310, the drain electrode 314, and the source electrode 316 constitute a thin film transistor 302. The thin film transistor 302 is disposed for each of the unit pixels. The undercoat layer 304, the gate insulating film 308, and the passivation film 312 are formed from inorganic insulation material such as $SiO_2$ or SiN. The semiconductor layer 306 is made from semiconductor such as low temperature poly-silicon (LTPS).

The drain electrode 314 and the source electrode 316 are covered with an interlayer dielectric 318, which is covered with a planarization layer 322. A signal line 317 intervenes between the interlayer dielectric 318 and the planarization layer 322. The drain electrode 314, the source electrode 316, and the signal line 317 are made from conductive material such as Al, Ag, Cu, Ni, Ti, or Mo. The interlayer dielectric 318 is made from inorganic insulation material such as $SiO_2$ or SiN. The planarization layer 322 is made from organic insulation material such as acrylic resin, having a flat upper surface.

There are pixel electrodes 324 on the planarization layer 322. Each pixel electrode 324 is connected to a connecting electrode 320, which penetrates the planarization layer 322 and the interlayer dielectric 318, for being connected to the source electrode 316. The pixel electrodes 324 are individually disposed for the respective unit pixels. In the embodiment, a display panel 10 is a top-emission type, and the pixel electrodes 324 are configured to be reflective electrodes. The connecting electrode 320 is made from conductive oxide such as ITO or IZO. The pixel electrodes 324 are formed to include conductive material such as Al, Ag, Cu, Ni, Ti, or Mo, or conductive oxide such as ITO or IZO.

The pixel electrodes 324 are covered with a pixel separation film 334. The pixel separation film 334 is called a rib or a bank. The pixel separation film 334 has openings 334a in which the respective pixel electrodes 324 are exposed at the bottom. An inner edge portion of the pixel separation film 334 with the openings 334a is on a peripheral portion of the pixel electrode 324; the pixel separation film 334 is formed in a forward tapered shape, in a cross-sectional view, with a smaller width at a portion higher from the bottom. The pixel separation film 334 is made from organic insulation material such as acrylic resin or polyimide resin.

There is a light-emitting layer 326 on the pixel electrodes 324 exposed at the bottom of the openings 334a in the pixel separation film 334. At least one layer of a hole transport layer, a hole injection layer, an electron transport layer, and electron injection layer may be formed to be with the light-emitting layer 326. The light-emitting layer 326 is continuously formed, by vapor deposition, in the adjacent openings 334a and over the pixel separation film 334 between them, to be a uniform film extending all over a display area A (so-called a continuous film). In such a case, the light-emitting layer 326 emits single color light; each of multiple colors such as red, green, and blue is extracted through a color filter or a color convert layer. Alternatively, the light-emitting layer 326 may be separated into individual pieces by using a mask in the vapor deposition. In such a case, the light-emitting layer 326 emits light in multiple colors such as red, green, and blue at the individual pieces for the respective unit pixels. The light-emitting layer 326 may be formed by coating, instead of the vapor deposition.

The light-emitting layer 326 and the pixel separation film 334 are covered with a counter electrode 328. The counter electrode 328 is formed to be a uniform film extending all over the display area A (so-called a continuous film). The light-emitting layer 326, and the pixel electrode 324 and the counter electrode 328 between which the light-emitting layer 326 is interposed constitute an organic light-emitting diode (OLED); one of the pixel electrode 324 and the counter electrode 328 is an anode, and another is a cathode; the light-emitting layer 326 is configured to emit light by a current flowing between the pixel electrode 324 and the counter electrode 328. The counter electrode 328 is made from transparent conductive material such as ITO or IZO, or a metal thin film such as MgAg.

The pixel separation film 334 and the counter electrode 328 are encapsulated by being covered with a sealing film (passivation film) 330, thereby being blocked from moisture. The sealing film 330 is formed from inorganic insulation material such as $SiO_2$ or SiN. The sealing film 330 is covered with a protective film 336. The protective film 336 is formed from organic insulation material such as acrylic resin, for securing mechanical tolerance.

Figure 4A:
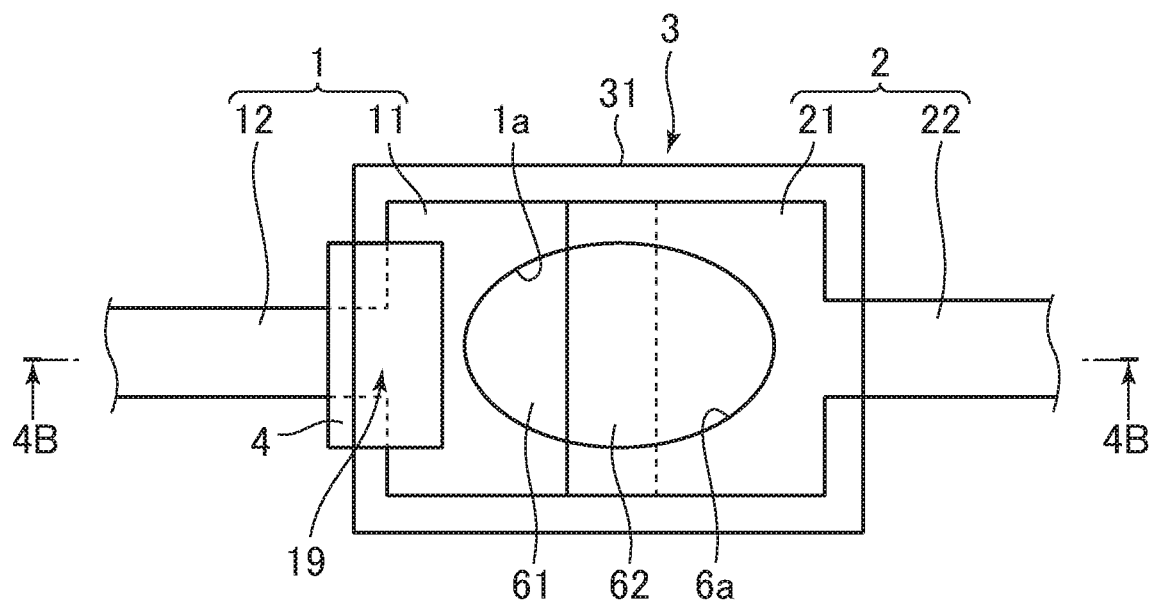
FIG. 4A is a schematic plan view of a connection structure.
Figure 4B:
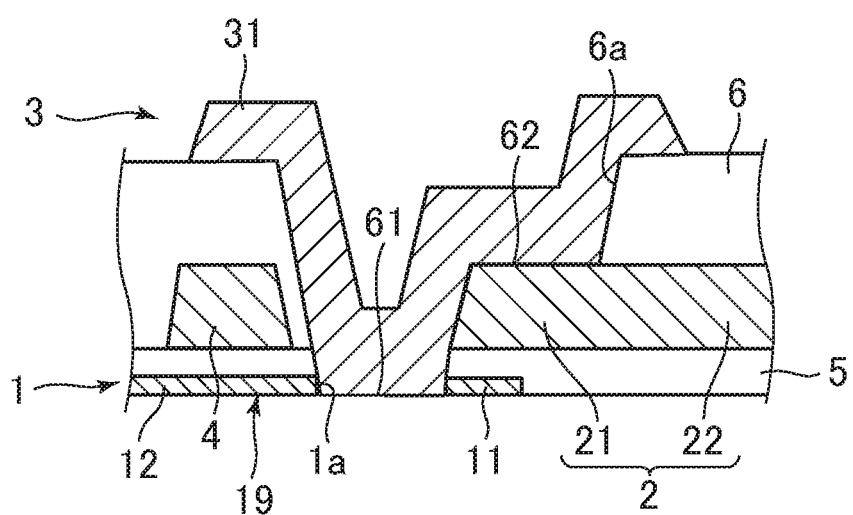
FIG. 4B is a schematic cross-sectional view of the connection structure.

The following is a description of the connection structure of the pixel circuit. FIG. 4A and FIG. 4B are a schematic plan view and a schematic cross-sectional view of a connection structure. An array substrate is equipped with a semiconductor layer 1, an insulating film 5 covering the semiconductor layer 1, a gate layer 2 on the insulating film 5, an insulating film 6 covering the gate layer 2, and a signal line layer 3 on the insulating film 6. The pixel circuit is composed of the semiconductor layer 1, the gate layer 2, and the signal line layer 3.

The semiconductor layer 1 is an example of a first wiring layer including the semiconductor layer 306 in FIG. 3. The insulating film 5 is an example of a first insulating film corresponding to the gate insulating film 308 in FIG. 3. The gate layer 2 is an example of a second wiring layer including the gate electrode 310 in FIG. 3. The insulating film 6 is an example of a second insulating film including the passivation film 312 in FIG. 3. The signal line layer 3 is an example of a third wiring layer including the drain electrode 314 and the source electrode 316 in FIG. 3.

The semiconductor layer 1 may be formed for polycrystalline silicon, with conductivity imparted by impurity doping. The semiconductor layer 1 includes the pad portion 11 and the line portion 12 connected to the pad portion 11. The pad portion 11 is a portion for connecting wiring layers to each other. The pad portion 11 is situated at an edge of the line portion 12 and is wider than the line portion 12. The gate layer 2 includes a pad portion 21 and a line portion 22 connected to the pad portion 21.

The pad portion 21 overlaps with a part of the pad portion 11 of the semiconductor layer 1 in a plan view. The pad portion 21 does not overlap with the line portion 12 of the semiconductor layer 1 in the plan view. In the illustration, the pad portion 21 overlaps with the pad portion 11, of the semiconductor layer 1, at a portion opposite to the line portion 12. Alternatively, the pad portion 21 may overlap with any portion of the pad portion 11 as long as it is not connected to the line portion 12.

The pad portion 11 or 21 has a contact hole 6a formed therein. The contact hole 6a includes a first area 61 penetrating the insulating films 5, 6 and the pad portion 11, and a second area 62 penetrating the insulating film 6 and having the pad portion 21 at the bottom. The first area 61 is defined in a region, not overlapping with the pad portion 21, of the pad portion 11. The pad portion 11 is, due to being formed from semiconductor, etched along with the insulating films 5, 6, during forming the contact hole 6a; a through-hole 1a is formed in the pad portion 11.

There is a hole filling portion 31 of the signal line layer 3 inside the contact hole 6a. The hole filling portion 31 covers the whole contact hole 6a in the plan view. The hole filling portion 31 is connected to the pad portion 11 of the semiconductor layer 1 and the pad portion 21 of the gate layer 2, inside the contact hole 6a. Thus, the pad portion 11 of the semiconductor layer 1 and the pad portion 21 of the gate layer 2 are electrically connected through the hole filling portion 31. The hole filling portion 31 fills the through-hole 1a of the pad portion 11 and is connected to the pad portion 11 at an inner edge of the through-hole 1a.

Returning to the explanations in FIG. 4A and FIG. 4B, in the embodiment, the above poor connection can be prevented by providing an etching-stop layer 4 that overlaps with at least a boundary 19 between the pad portion 11 and the line portion 12 in the plan view.

The etching-stop layer 4 overlaps with the boundary 19 in the plan view, and also overlaps with a part of the pad portion 11 including the boundary 19 and a part of the line portion 12 including the boundary 19, in the plan view. The boundary 19 is a virtually extended line of a contour line of the pad portion 11, for example. The etching-stop layer 4 in the illustration overlaps with the whole boundary 19 in the plan view but may alternatively overlap with a part of the boundary 19 in the plan view.

By forming the etching-stop layer 4, the semiconductor layer 1 has an area that is not etched during forming the contact hole 6a because of overlapping with the etching-stop layer 4 in the plan view, thereby keeping the pad portion 11 and the line portion 12 integrated without separation.

In the example, the etching-stop layer 4 is the same layer as the pad portion 21 and the line portion 22 of the gate layer 2. That is, the etching-stop layer 4 is included in the gate layer 2. Additionally in the example, the etching-stop layer 4 is different from the pad portion 21 and is physically and electrically separated from the pad portion 21.

Figure 5A:
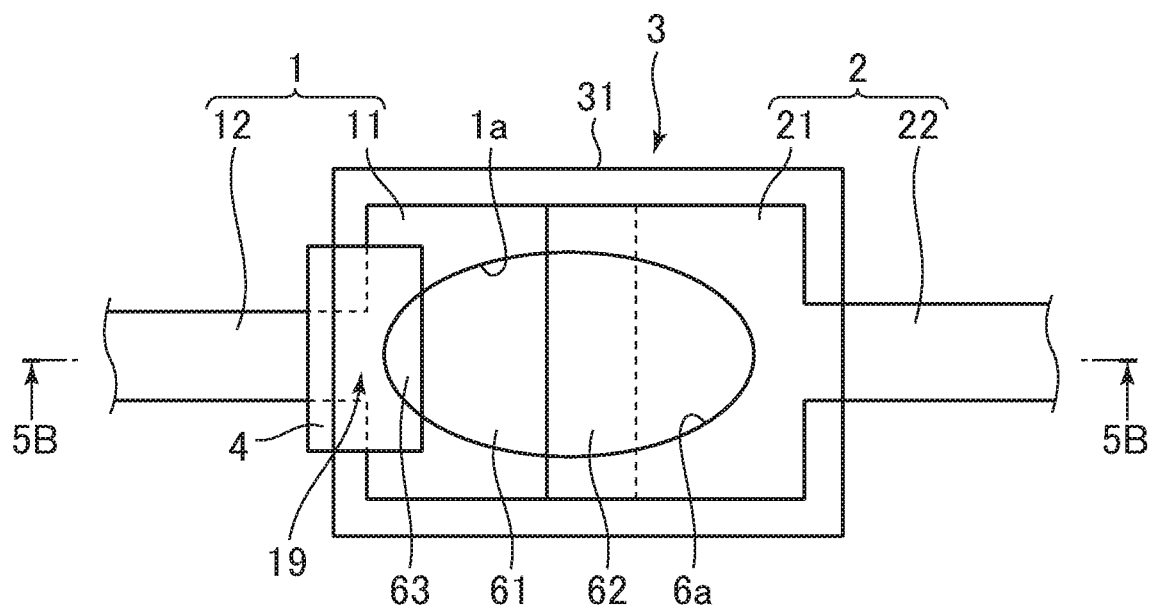
FIG. 5A is a schematic plan view of another connection structure.
Figure 5B:
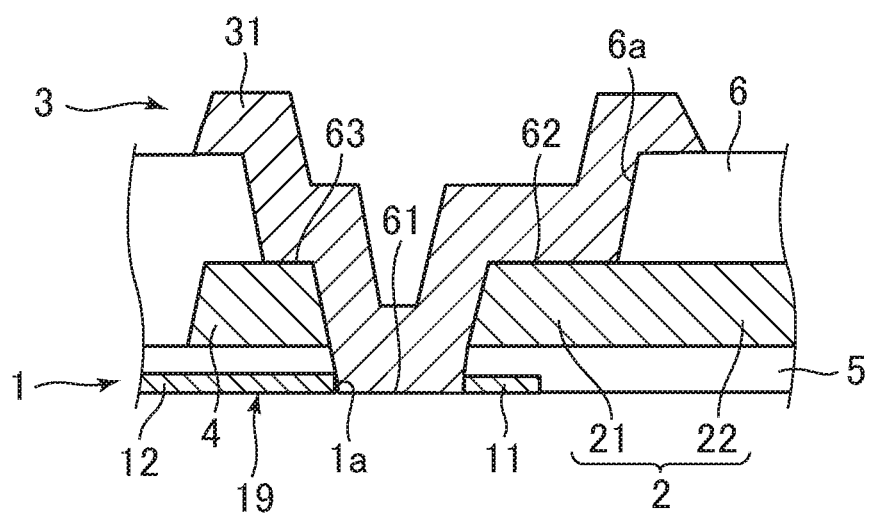
FIG. 5B is a schematic cross-sectional view of the other connection structure.

In the above example, the contact hole 6a includes the first area 61 penetrating the insulating films 5, 6 and the pad portion 11, and the second area 62 penetrating the insulating film 6 with the pad portion 21 at the bottom; alternatively as shown in FIG. 5A and FIG. 5B, the contact hole 6a may further include a third area 63 with the etching-stop layer 4 at the bottom, in addition to the first area 61 and the second area 62. In the example, the through-hole 1a of the semiconductor layer 1 is formed between the etching-stop layer 4 and the pad portion 21 of the gate layer 2 in the plan view. The hole filling portion 31 is also connected to the etching-stop layer 4.

Figure 6A:
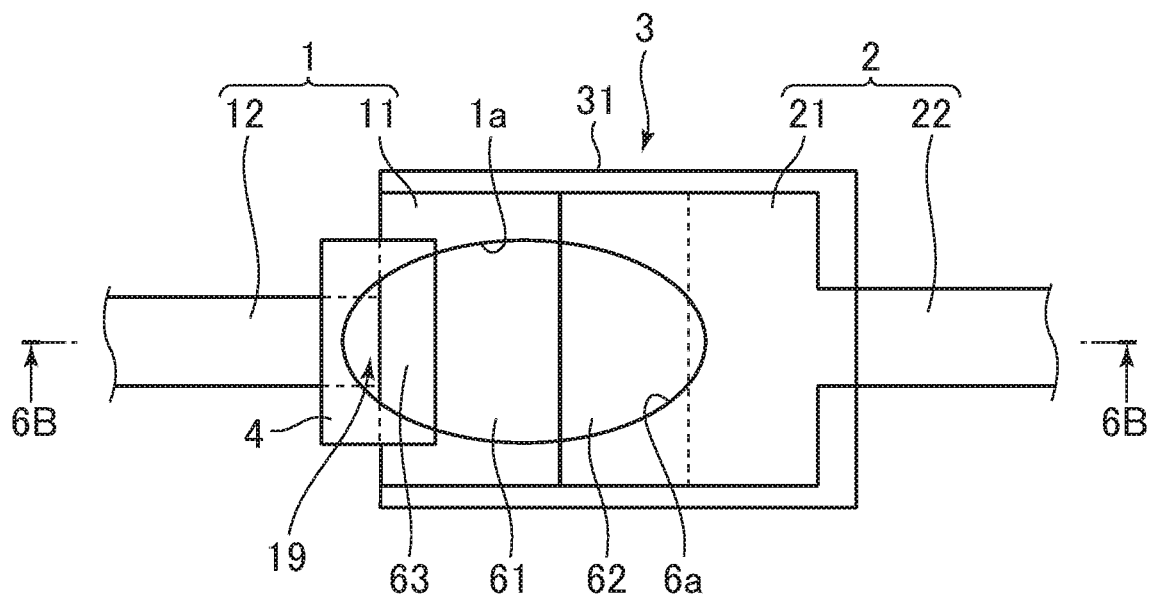
FIG. 6A is a schematic plan view of the other connection structure.
Figure 6B:
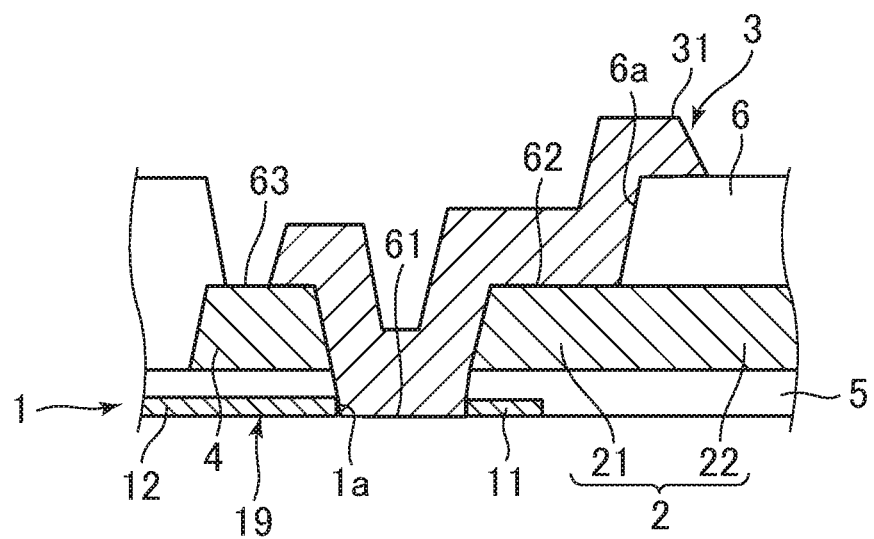
FIG. 6B is a schematic cross-sectional view of the other connection structure.

Forming the etching-stop layer 4, as shown in FIG. 6A and FIG. 6B, can prevent separation of the pad portion 11 and the line portion 12 and can keep good electrical connection between the semiconductor layer 1 and the gate layer 2, in spite of manufacturing errors in a formation position of the contact hole 6a or the hole filling portion 31. Specifically, assuming that the contact hole 6a has the inner edge out of position beyond the boundary 19 between the pad portion 11 and the line portion 12 to be on the line portion 12 and to include the boundary 19 in the plan view, the boundary 19 and the vicinity are protected by the etching-stop layer 4, the separation of the pad portion 11 and the line portion 12 is prevented. Thus, assuming that an outer edge of the hole filling portion 31 is inwardly away from the inner edge of the contact hole 6a in front of the line portion 12, electrical connection between the semiconductor layer 1 and the gate layer 2 through the hole filling portion 31 can be established.

Figure 7:
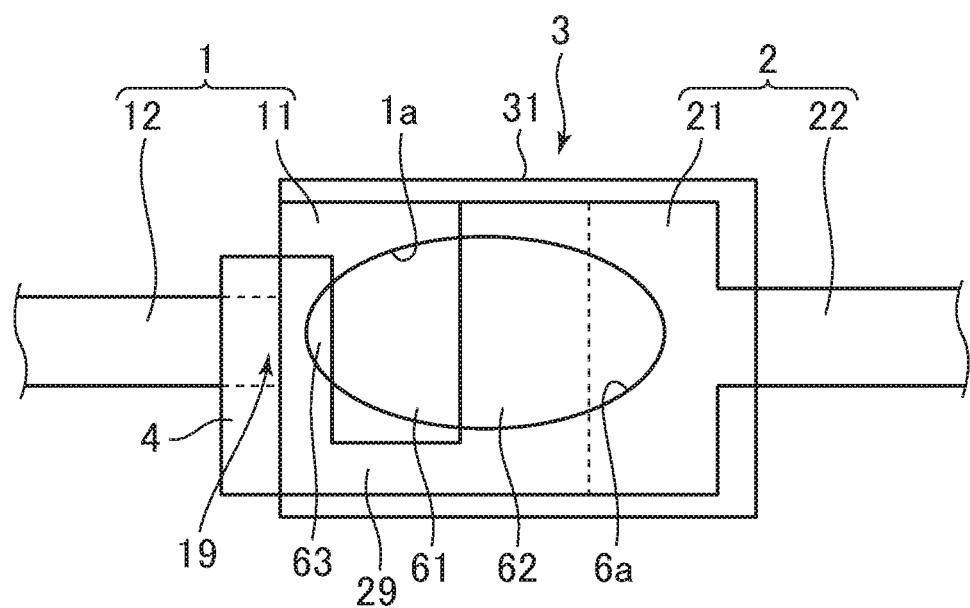
FIG. 7 is a schematic plan view of still another connection structure.

As shown in FIG. 7, the etching-stop layer 4 may be integrated with the pad portion 21 of the gate layer 2 and may be physically and electrically connected to the pad portion 21. In the example, the etching-stop layer 4 and the pad portion 21 are continuously formed by means of a connection portion 29, next to a crevice secured for forming the first area 61 (the through-hole 1a) of the contact hole 6a between the etching-stop layer 4 and the pad portion 21.

Figure 8A:
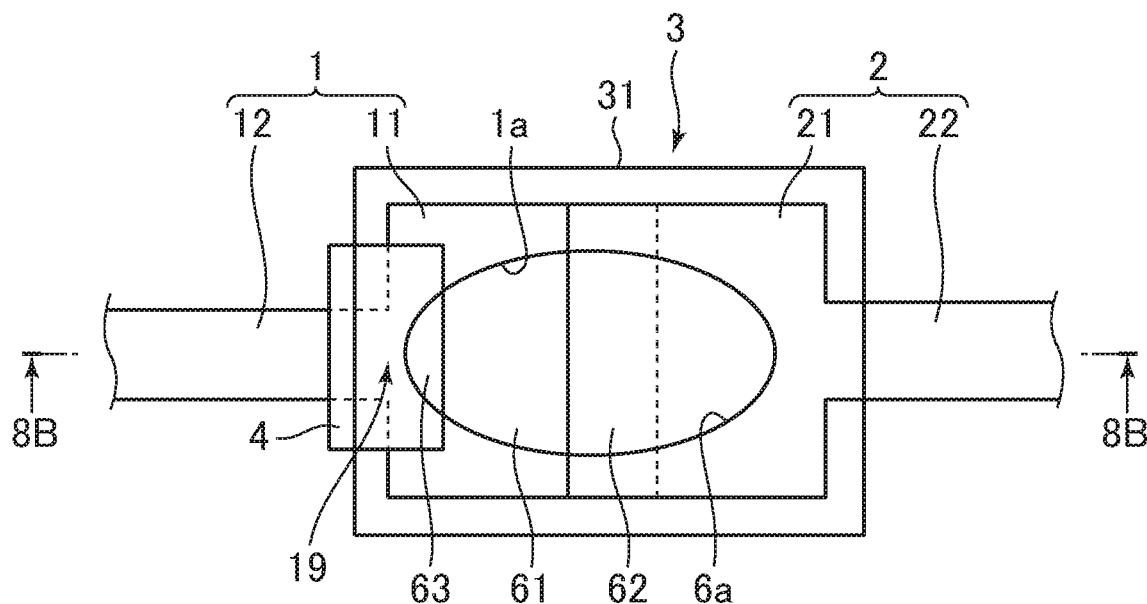
FIG. 8A is a schematic plan view of yet another connection structure.
Figure 8B:
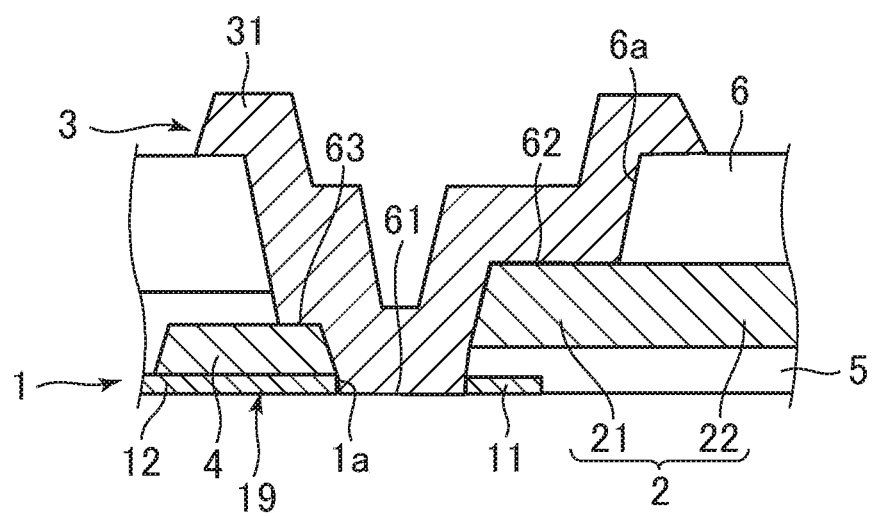
FIG. 8B is a schematic cross-sectional view of the yet other connection structure.

As shown in FIG. 8A and FIG. 8B, the etching-stop layer 4 may be formed in a different layer rather than in the same layer as the pad portion 21 and the line portion 22 of the gate layer 2. The etching-stop layer 4 may be formed from the same conductive material as the gate layer 2. In the example, the etching-stop layer 4 is formed on the semiconductor layer 1, under the insulating film 5, and different from the semiconductor layer 1. Alternatively, the etching-stop layer 4 may be formed on the insulating film 6.

Figure 9:
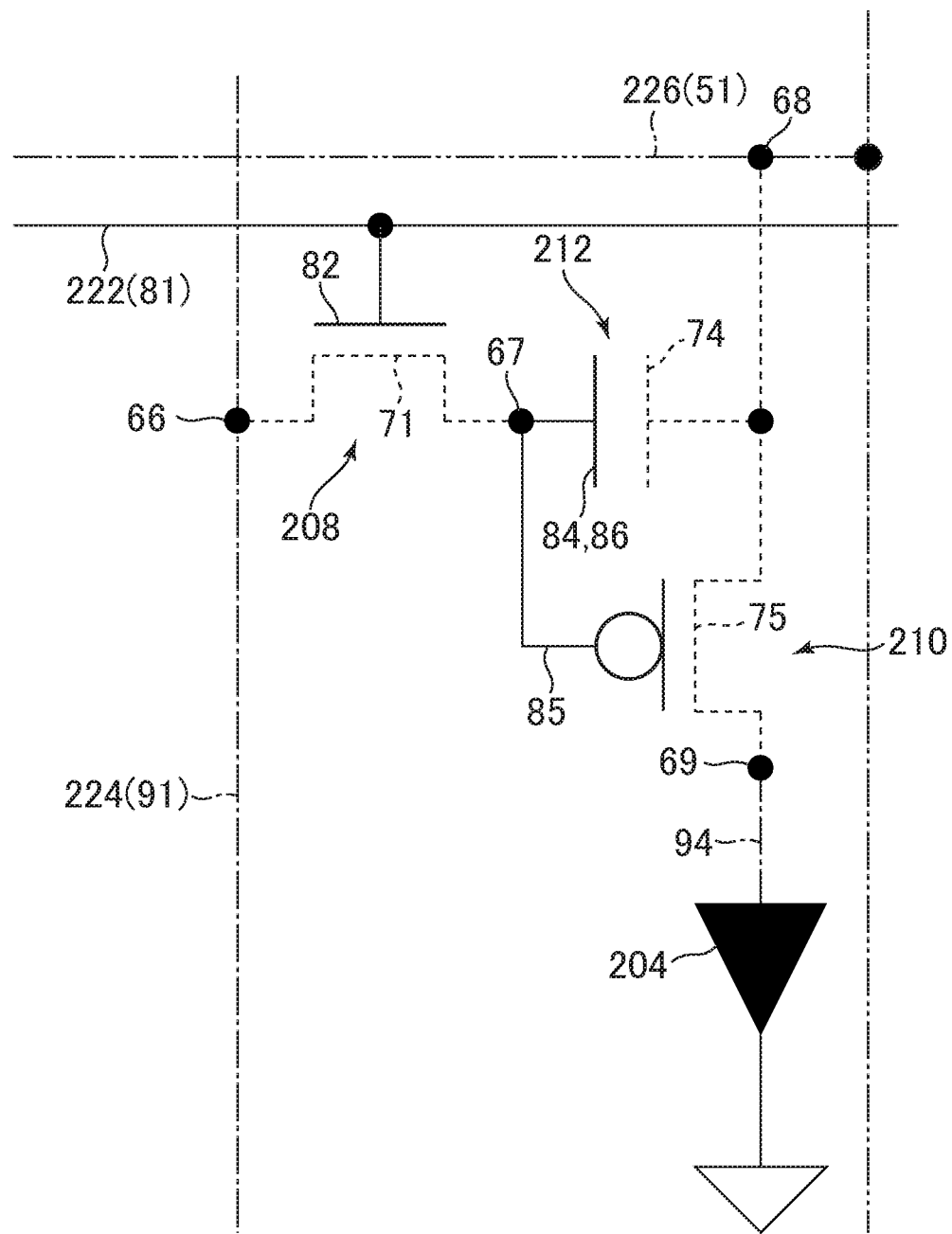
FIG. 9 is a circuit diagram of a pixel circuit.

The following is a specific example of a pixel circuit. FIG. 9 is a circuit diagram of a concrete example of a pixel circuit. In FIG. 9, the semiconductor layer (first wiring layer) is shown by a broken line, the gate layer (second wiring layer) is shown by a solid line, the signal line layer (third wiring layer) is shown by a dotted line, and the power line layer is shown in a double-dotted line.

Figure 10:
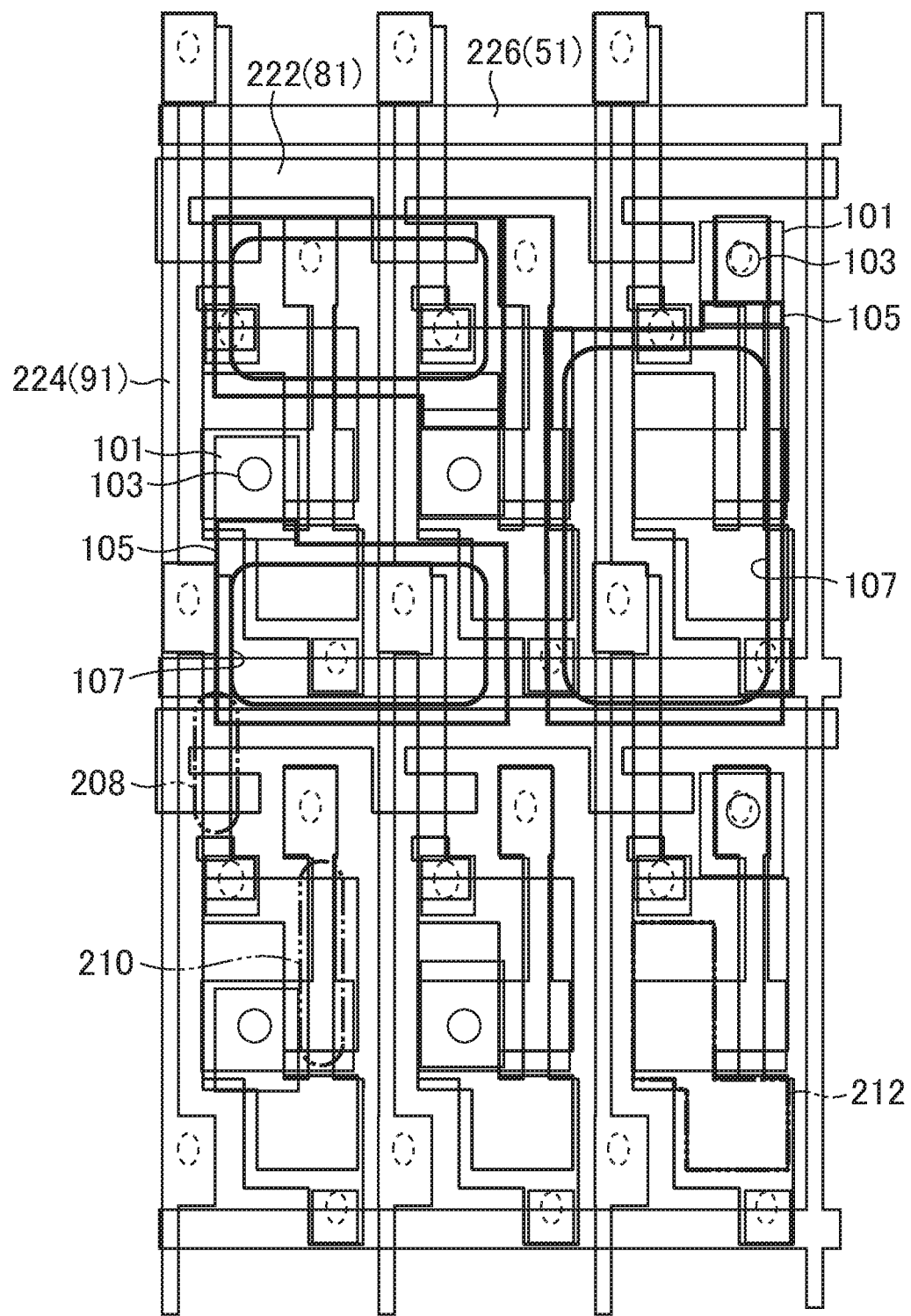
FIG. 10 is a plan view of the pixel circuit.
Figure 11:
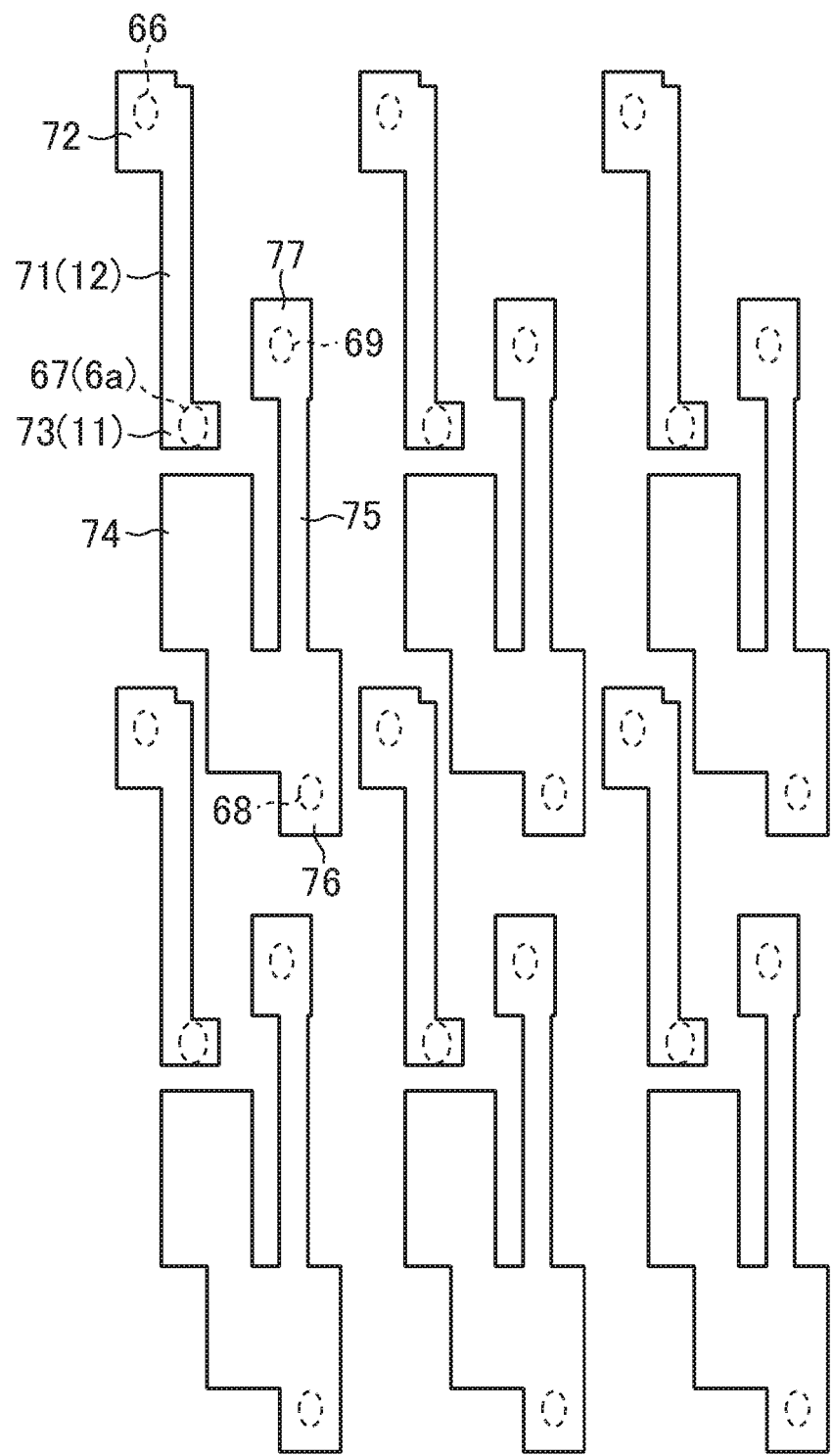
FIG. 11 is a plan view of a semiconductor layer (first wiring layer).
Figure 12:
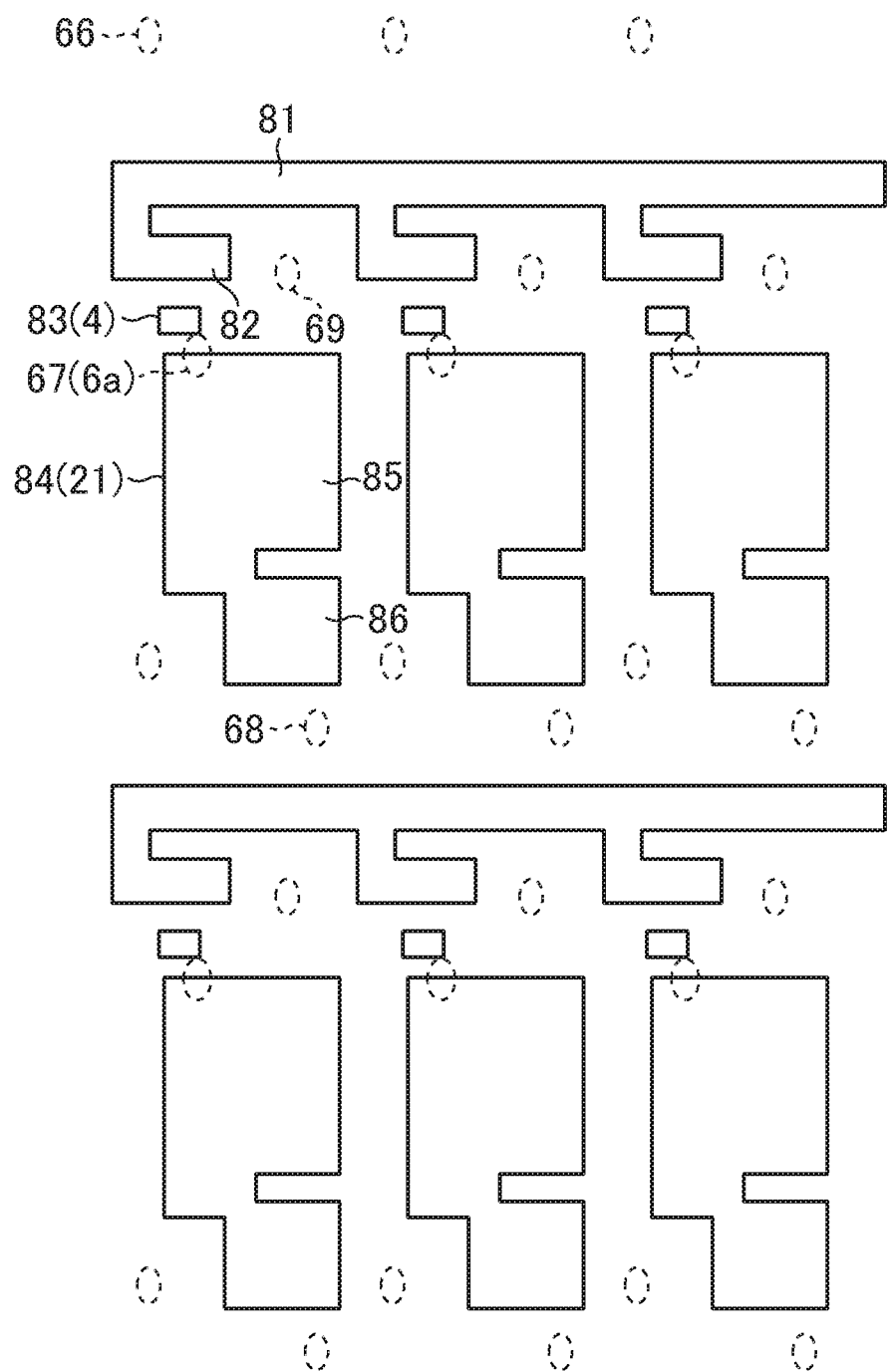
FIG. 12 is a plan view of a gate layer (second wiring layer).
Figure 13:
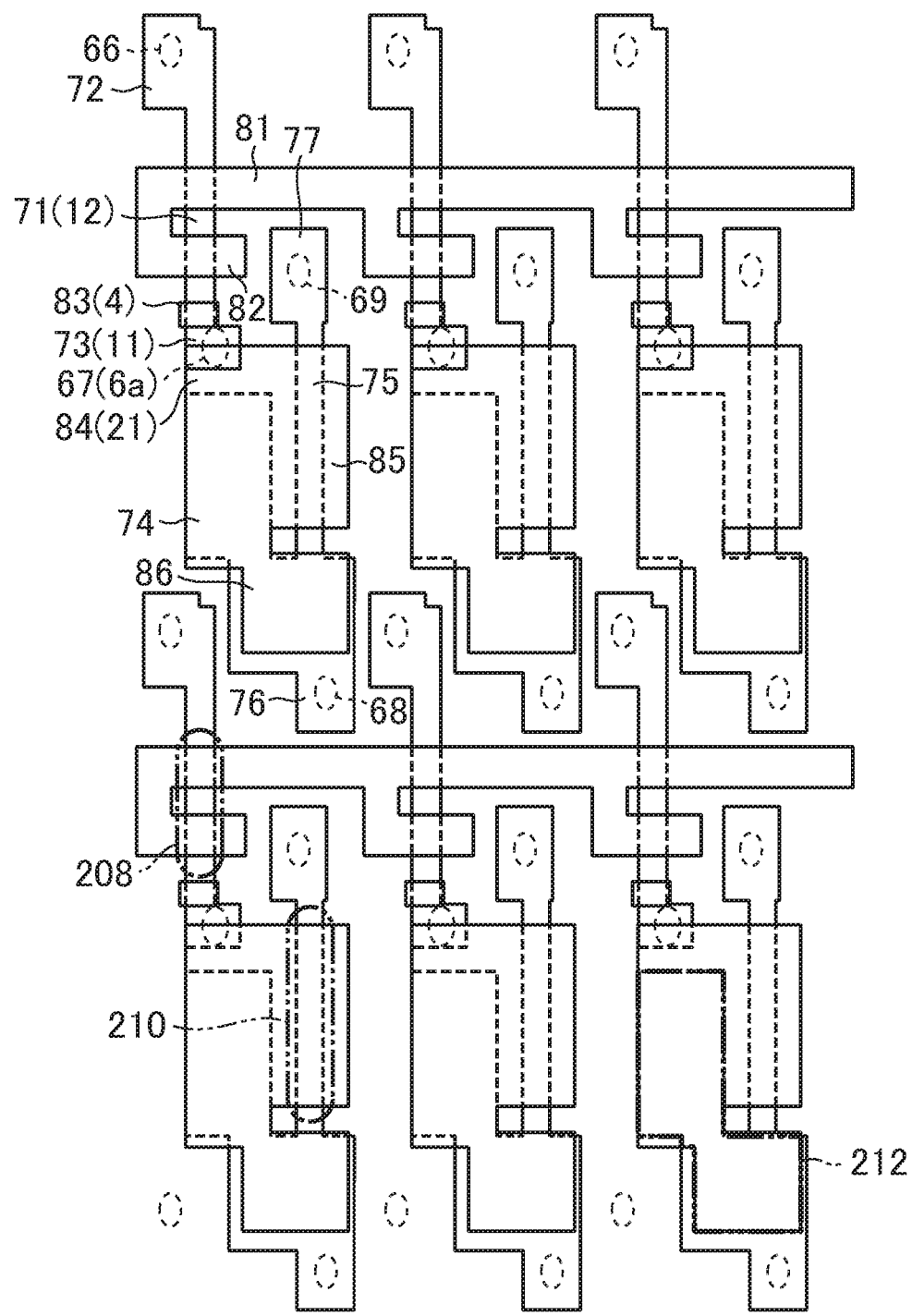
FIG. 13 is a plan view of the semiconductor layer and the gate layer.
Figure 14:
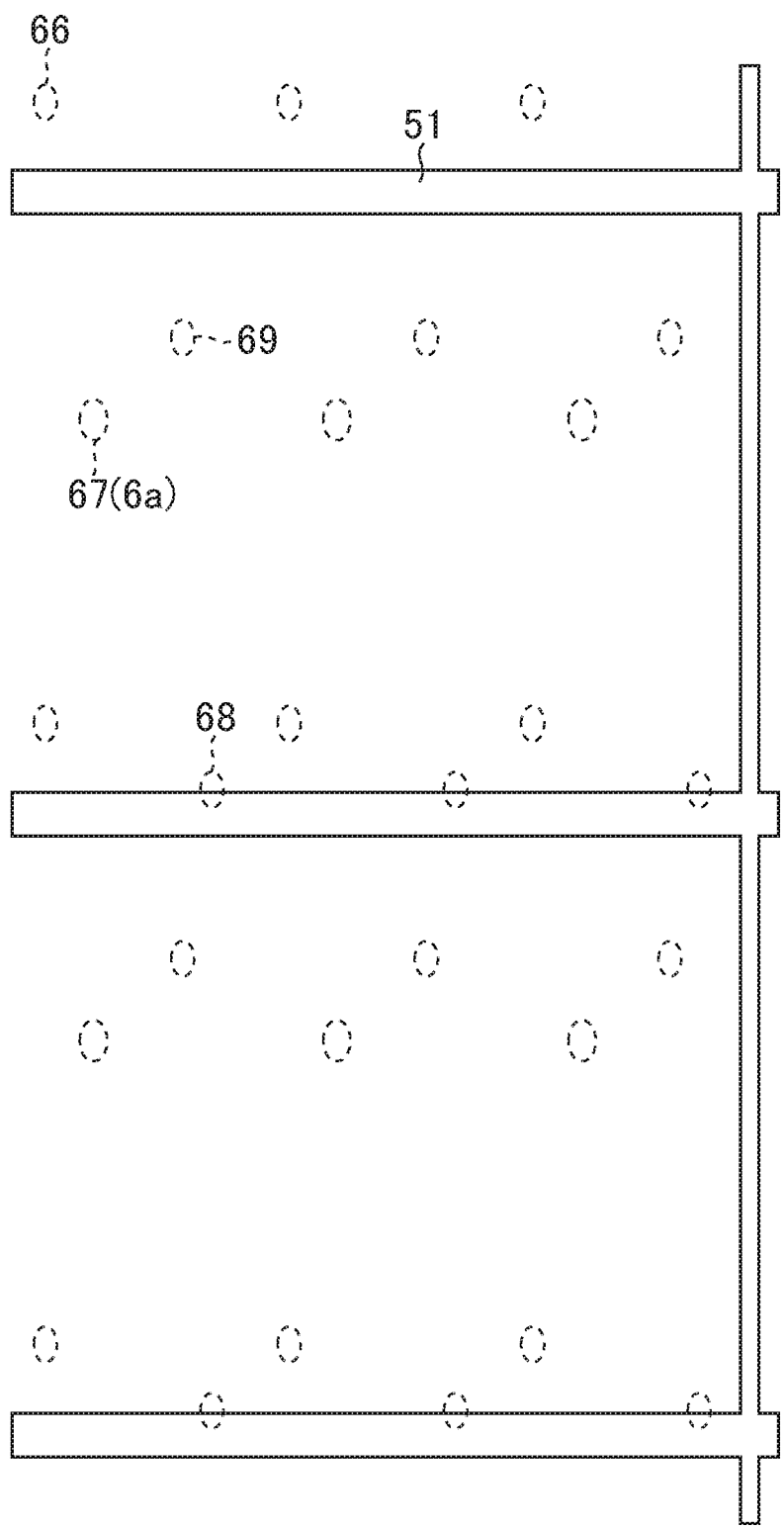
FIG. 14 is a plan view of a power line layer.
Figure 15:
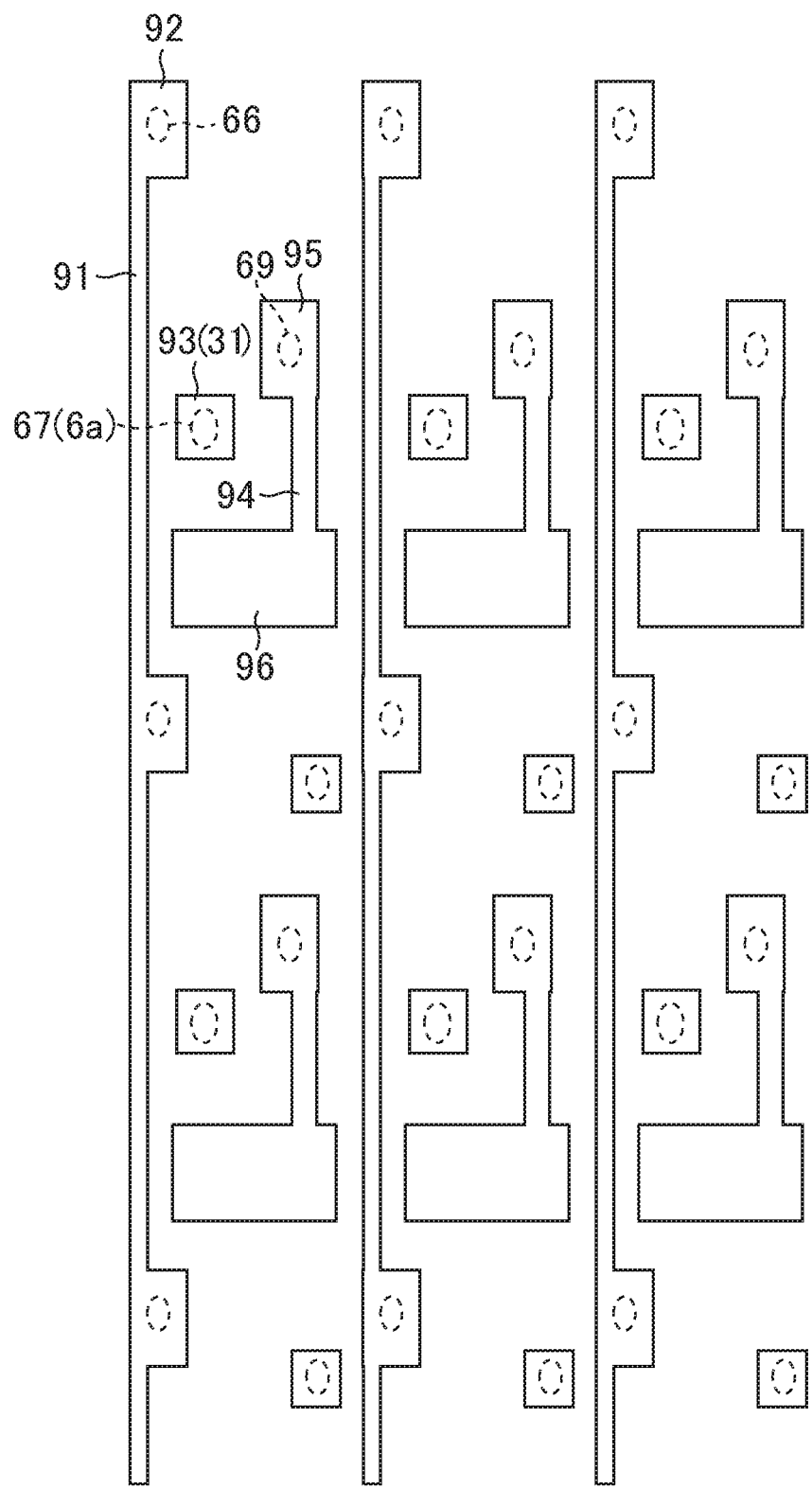
FIG. 15 is a plan view of a signal line layer (third wiring layer).
Figure 16:
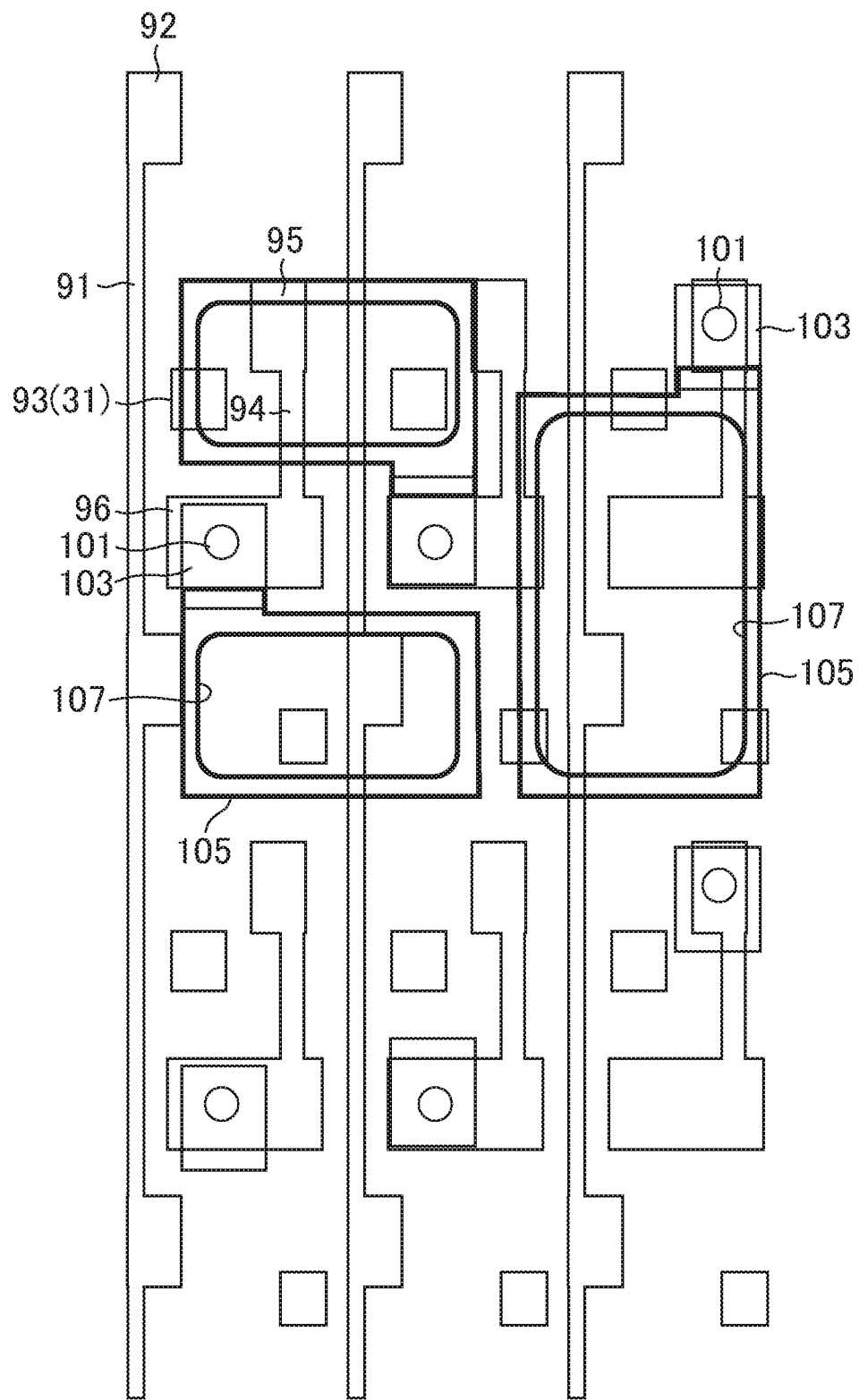
FIG. 16 is a plan view of the signal line layer and a pixel electrode.

FIG. 10 is a plan view of a concrete example of the pixel circuit. FIGS. 11 to 16 are diagrams of respective layers of the pixel circuit in FIG. 10. FIG. 11 is a plan view of a semiconductor layer. FIG. 12 is a plan view of a gate layer. FIG. 13 is a plan view of the semiconductor layer and the gate layer. FIG. 14 is a plan view of a power line layer. FIG. 15 is a plan view of a signal line layer. FIG. 16 is a plan view of the signal line layer and a pixel electrode.

As illustrated in FIG. 2, the pixel circuit includes the sampling TFT 208, the drive TFT 210, and the capacitor 212, and is connected to the scanning signal line 222, the video signal line 224, and the drive power line 226.

In FIG. 11, the semiconductor layer has the channel portion 71. The channel portion 71 at both edges has respective pad portions 72, 73. The pad portions 72, 73 have respective contact holes 66, 67 formed therein. The pad portion 73, the channel portion 72, and the contact hole 67 correspond to the pad portion 11, the line portion 12, and the contact hole 6a, respectively, mainly illustrated in FIG. 4 and FIG. 4B.

Additionally, the semiconductor layer has a capacitance portion 74 and a channel portion 75 that are integrated. The capacitance portion 74 and the channel portion 75 at both edges have respective pad portions 76, 77. The pad portions 76, 77 have respective contact holes 68, 69 formed therein.

In FIG. 12, the gate layer has a line portion 81 and a gate portion 82 extending in an L-shape from the line portion 81. The line portion 81 corresponds to the scanning signal line 222 (FIG. 9). The gate layer has an etching-stop layer 83. The etching-stop layer 83 corresponds to the etching-stop layer 4, mainly illustrated in FIG. 4 and FIG. 4B. Additionally, the gate layer has a capacitance portion 84, a gate portion 85, and a capacitance portion 86 that are integrated. The capacitance portion 84 corresponds to the pad portion 21 mainly illustrated in FIG. 4 and FIG. 4B.

Figure 17:
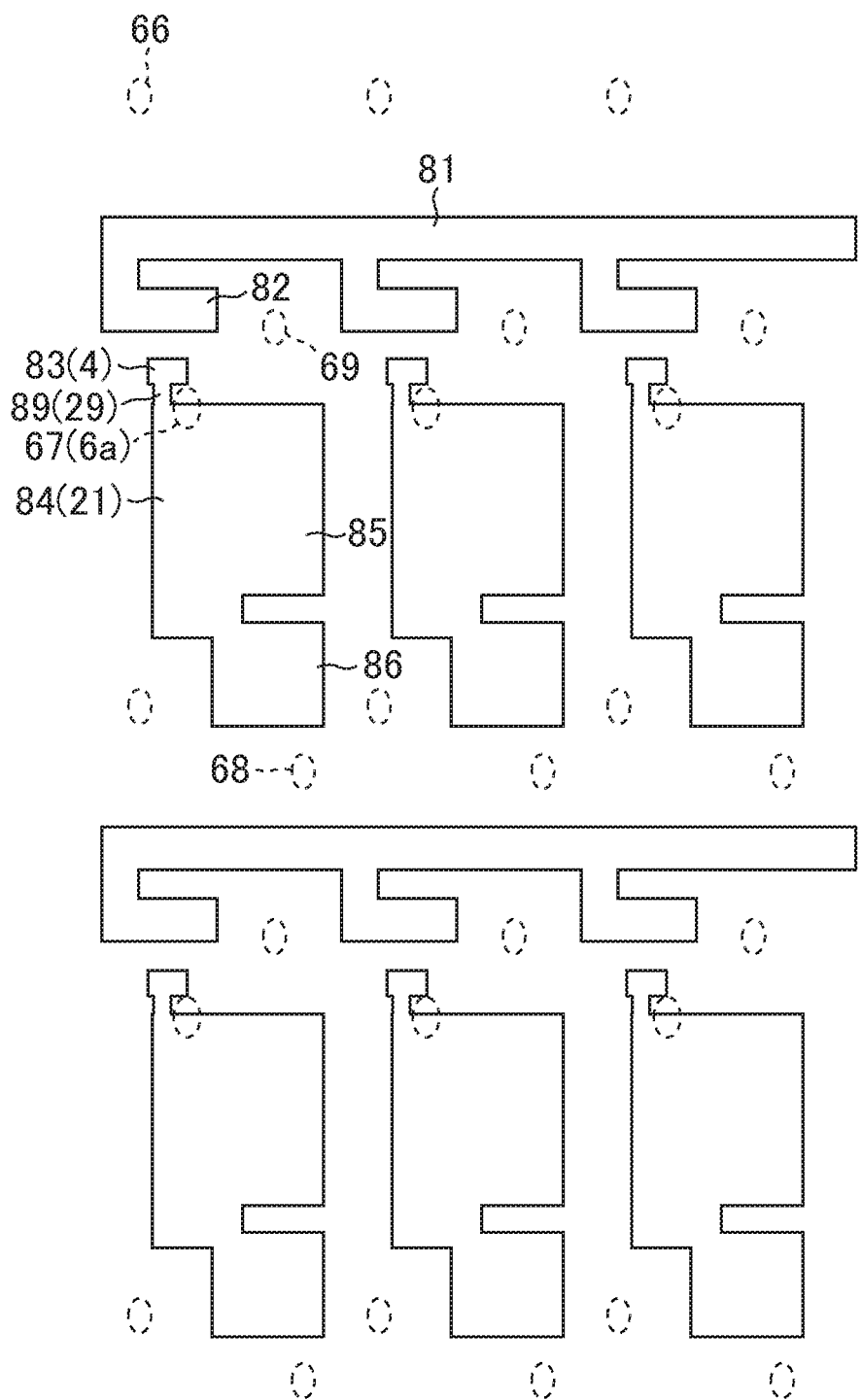
FIG. 17 is a plan view of another gate layer (second wiring layer).
Figure 18A:
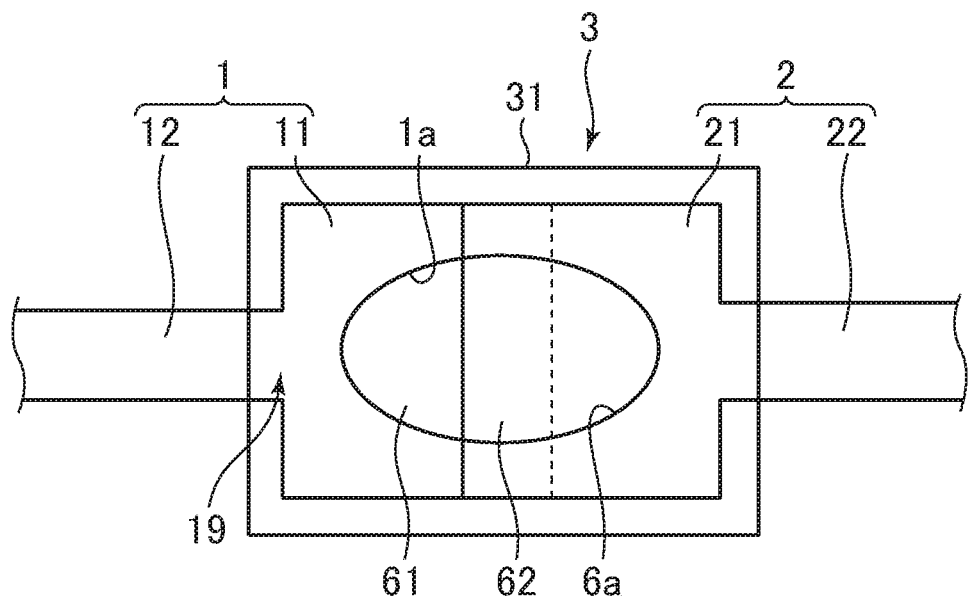
FIG. 18A is a plan view of a referenced connection structure.
Figure 18B:
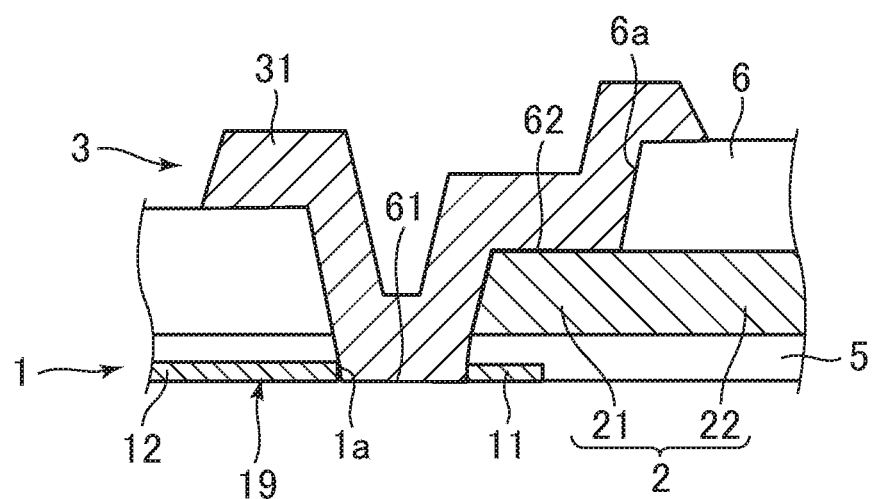
FIG. 18B is a cross-sectional view of the referenced connection structure.
Figure 19A:
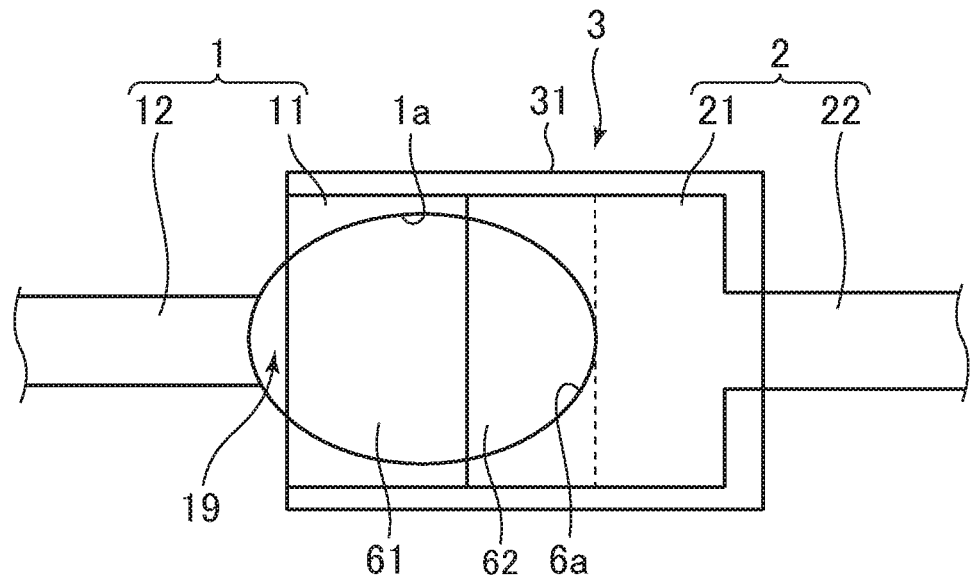
FIG. 19A is a plan view of another referenced connection structure.
Figure 19B:
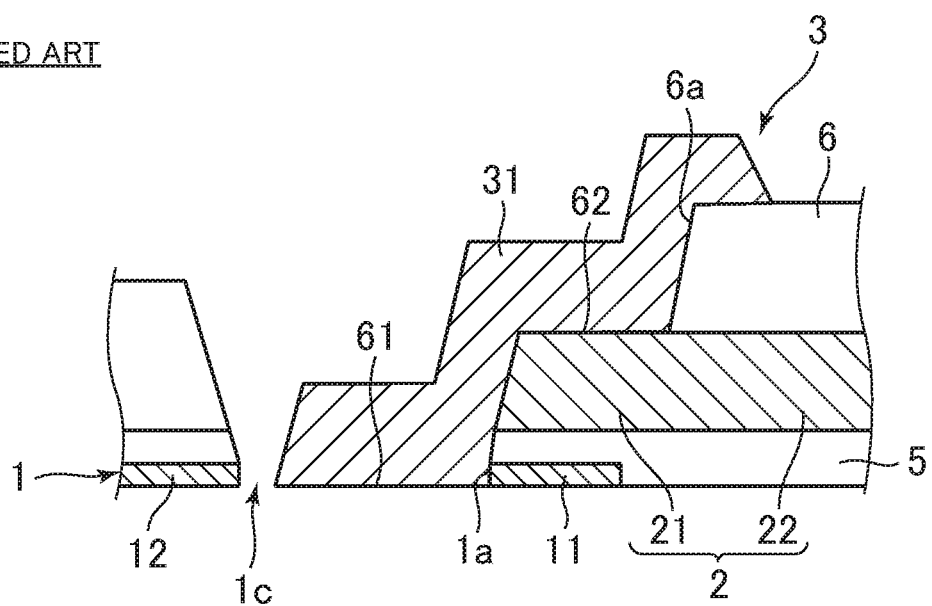
FIG. 19B is a cross-sectional view of the other referenced connection structure.

In spite of the example where the etching-stop layer 83 is separated from the capacitance portion 84, the etching-stop layer 83 and the capacitance portion 84 may be integrated by means of a connection portion 89, as shown in FIG. 17. The connection portion 89 corresponds to the connection portion 29 in FIG. 7.

In FIG. 13, the channel portion 71 of the semiconductor layer overlaps with the line portion 81 and the gate portion 82 of the gate layer in the plan view, constituting the sampling TFT 208 (FIG. 9). The channel portion 75 of the semiconductor layer overlaps with the gate portion 85 of the gate layer in the plan view, constituting the drive TFT 210 (FIG. 9). The capacitance portion 74 of the semiconductor layer overlaps with the capacitance portions 84, 86 of the gate layer in the plan view, constituting the capacitor 212 (FIG. 9).

The capacitance portion 84 of the gate layer overlaps with a part of the pad portion 73 of the semiconductor layer in the plan view. The capacitance portion 84 of the gate layer is situated not to overlap with the channel portion 71 of the semiconductor layer in the plan view. The contact hole 67 is formed to have a first area penetrating the pad portion 73 of the semiconductor layer, and a second area where the capacitance portion 84 of the gate layer is the bottom. The etching-stop layer 83 overlaps with the boundary between the pad portion 73 and the channel portion 71 of the semiconductor layer in the plan view. The contact hole 67 may include a third area where the etching-stop layer 83 is the bottom.

In FIG. 14, the power line layer has a line portion 51. The line portion 51 is connected, through a contact hole 68, to the pad portion 76 (FIG. 11) situated at the capacitance portion 74 and the channel portion 75 of the semiconductor layer. The line portion 51 corresponds to the drive power line 226 (FIG. 9) connected to the drive TFT 210 and the capacitor 212. The line portion 51 corresponds to the signal line 317 in FIG. 3.

In FIG. 15, the signal line layer has a line portion 91 and a pad portion 92 connected to the line portion 91. The pad portion 92 connected to the line portion 91 is, through a contact hole 66, connected to the pad portion 72 (FIG. 11) in the channel portion 71 of the semiconductor layer. The line portion 91 constitutes the video signal line 224 (FIG. 9) connected to the sampling TFT 208.

The signal line layer has a hole filling portion 93. The hole filling portion 93 corresponds to the hole filling portion 31 mainly illustrated in FIG. 4 and FIG. 4B. The hole filling portion 93 is formed to cover the whole contact hole 67 in the plan view. The hole filling portion 93 is connected to the pad portion 73 of the semiconductor layer and the capacitance portion 84 of the gate layer, inside the contact hole 67. Thus, the pad portion 73 of the semiconductor layer is electrically connected to the capacitance portion 84 of the gate layer, through the hole filling portion 93.

That is, the sampling TFT 208 and the drive TFT 210 are connected to each other, through the hole filling portion 93 inside the contact hole 67 (FIG. 9). More specifically, the channel portion 71 of the sampling TFT 208 on one side (one of the source electrode and the drain electrode) is connected to the video signal line 224 (91); the channel portion 71 on another side is connected to the gate portion 85 of the drive TFT 210 and the capacitance portions 84, 86 of the capacitor 212.

The signal line layer has a line portion 94. Both edges of the line portion 94 is connected to respective pad portions 95, 96. The pad portion 95 connected to the line portion 94 is, through a contact hole 69, connected to the pad portion 77 (FIG. 11) of the capacitance portion 74 and the channel portion 75 in the semiconductor layer.

In FIG. 16, there is a pixel electrode 105 above the signal line layer. Specifically, a connecting electrode 103 is connected to the pad portion 96 of the signal line layer through a contact hole 101; the pixel electrode 105 is connected to the connecting electrode 103. An opening 107 exposing the pixel electrode 105 is formed inside the pixel electrode 105 in the plan view. The connecting electrode 103, the pixel electrode 105, and the opening 107 correspond to the connecting electrode 320, the pixel electrode 324, and the opening 334*a* in FIG. 3, respectively.

In the embodiment, an organic electroluminescence display device is illustrated, another example may be a liquid crystal display device, another self-luminous display device, an electronic paper type display device with electrophoresis elements, or every kind of flat panel type display device. Needless to say, it can be applied to small, medium and large sizes without any particular limitation.

It is understood that, within the scope of the idea of the present invention, any person in the field may come across various examples of changes and modifications, and that these examples of changes and modifications also fall within the scope of the present invention. For example, for each of the above-mentioned embodiments, any addition, deletion, or design change of constituent elements, or any addition, omission, or conditional change of processes, by any person in the field, is allowed to be included in the scope of the present invention as long as it has the gist of the present invention.

What is claimed is:

1. A display device comprising:
a first wiring layer including a first pad portion and a first line portion connected to the first pad portion;
a first insulating film covering the first wiring layer;
a second wiring layer on the first insulating film, the second wiring layer overlapping with a part of the first pad portion in a plan view, the second wiring layer including a second pad portion not overlapping with the first line portion in the plan view;
an etching-stop layer overlapping with at least a boundary between the first pad portion and the first line portion in the plan view;
a second insulating film covering the second wiring layer, the second insulating film having a contact hole, the contact hole including a first area where the second insulating film, the first insulating film, and the first pad portion are penetrated, the contact hole including a second area where the second insulating film is penetrated and the second pad portion is a bottom; and
a third wiring layer inside the contact hole, the third wiring layer connected to the first pad portion and the second pad portion.

2. The display device according to claim 1, wherein the contact hole includes a third area where the etching-stop layer is a bottom.

3. The display device according to claim 1, wherein the second pad portion and the etching-stop layer are of the same layer.

4. The display device according to claim 1, wherein the second pad portion and the etching-stop layer are separated.

5. The display device according to claim 1, wherein the second pad portion and the etching-stop layer are integrated.

6. The display device according to claim 1, wherein the first wiring layer is made from polycrystalline silicon.

7. The display device according to claim 1, wherein the first wiring layer, the second wiring layer, and the third wiring layer constitute a pixel circuit.

8. The display device according to claim 7, wherein
the pixel circuit includes a first thin film transistor and a second thin film transistor, and
the first thin film transistor and the second thin film transistor are connected to each other through the third wiring layer inside the contact hole.

9. The display device according to claim 8, wherein the first thin film transistor is a sampling thin film transistor, with the first pad portion and the first line portion, including a source electrode and a drain electrode, one of which is connected to a video signal line, and another of which is connected to the second thin film transistor.

10. The display device according to claim 8, wherein the second thin film transistor is a driving thin film transistor, with the second pad portion, including a gate electrode connected to the first thin film transistor, the driving thin film transistor including a source electrode and a drain electrode, one of which is connected to a light-emitting element.

11. The display device according to claim 8, wherein
the pixel circuit includes a capacitor connected between the first thin film transistor and the second thin film transistor, and
the second pad portion constitutes a part of the capacitor.

12. The display device according to claim 1, further comprising a plurality of pixel circuits, wherein
the contact hole encompasses the boundary between the first pad portion and the first line portion in the plan view in at least one of the plurality of pixel circuit, and
an outer edge of the third wiring layer is inwardly away from an inner edge of the contact hole, which overlaps with the first line portion in the plan view.

* * * * *